US009559158B2

(12) United States Patent
Sin et al.

(10) Patent No.: US 9,559,158 B2
(45) Date of Patent: Jan. 31, 2017

(54) METHOD AND APPARATUS FOR AN INTEGRATED CAPACITOR

(71) Applicant: The Hong Kong University of Science and Technology, Kowloon (HK)

(72) Inventors: Kin On Johnny Sin, Kowloon (HK); Rongxiang Wu, Chengdu (CN); Xiangming Fang, Kowloon (HK)

(73) Assignee: THE HONG KONG UNIVERSITY OF SCIENCE AND TECHNOLOGY, Kowloon (HK)

( * ) Notice: Subject to any disclaimer, the term of this patent is extended or adjusted under 35 U.S.C. 154(b) by 0 days.

(21) Appl. No.: 14/991,078

(22) Filed: Jan. 8, 2016

(65) Prior Publication Data
US 2016/0204189 A1 Jul. 14, 2016

Related U.S. Application Data (60) Provisional application No. 62/125,065, filed on Jan. 12, 2015.

(51) Int. Cl.
*H01L 49/02* (2006.01)
(52) U.S. Cl.
CPC ...................... *H01L 28/60* (2013.01)
(58) Field of Classification Search
CPC ............... H01L 27/10829; H01L 27/10838; H01L 27/10808; H01L 27/10835; H01L 27/10852; H01L 28/91; H01L 28/40; H01L 27/0676; H01L 27/0716; H01L 27/0755; H01L 27/0777; H01L 27/0788; H01L 27/0794; H01L 27/0805
See application file for complete search history.

(56) References Cited

U.S. PATENT DOCUMENTS

| 6,319,777 B1 | 11/2001 | Hueting et al. |
| 6,362,012 B1 | 3/2002 | Chi et al. |
| 6,821,861 B1 | 11/2004 | Goldbach et al. |
| 7,385,241 B2 | 6/2008 | Choi |
| 7,880,268 B2 | 2/2011 | Cremer et al. |
| 8,026,558 B2 | 9/2011 | Grebs et al. |
| 8,222,104 B2 | 7/2012 | Booth et al. |

(Continued)

FOREIGN PATENT DOCUMENTS

| CN | 101946304 A | 1/2011 |
| JP | 2010045297 A | 2/2010 |

OTHER PUBLICATIONS

Klootwijk J.H., et.al., "Ultrahigh Capacitance Density for Multiple ALD-Grown MIM Capacitor Stacks in 3-D Silicon", IEEE Electron Device Letters, vol. 29, No. 7, Jul. 2008, pp. 740-742.

(Continued)

*Primary Examiner* — Roy Potter
*Assistant Examiner* — Paul Patton
(74) *Attorney, Agent, or Firm* — Amin, Turocy & Watson, LLP (57) ABSTRACT

An integrated capacitor can be fabricated with both electrodes formed by trenches for low resistance. According to one embodiment, the capacitor can comprise a first trench electrode, one or more dielectric layers, and a second trench electrode. The first trench electrode and the second trench electrode can be fabricated in different trenches to improve capacitance density and resistance of the integrated capacitor.

26 Claims, 11 Drawing Sheets

(56) References Cited

U.S. PATENT DOCUMENTS

| | | |
|---|---|---|
| 8,384,140 B2 | 2/2013 | Kemerer et al. |
| 8,455,979 B2 | 6/2013 | Booth et al. |
| 2002/0123159 A1 | 9/2002 | Chi et al. |
| 2007/0155090 A1* | 7/2007 | Barth .................. H01L 23/5223 438/250 |
| 2007/0181924 A1* | 8/2007 | Baumgartner ...... H01L 23/5223 257/296 |
| 2010/0181645 A1* | 7/2010 | Marenco ............. H01L 27/0694 257/532 |

OTHER PUBLICATIONS

F. Roozeboom et.al., "Ultrahigh-Density Trench Capacitors in Silicon and Their Application to Integrated DC-DC Conversion", Proceedings of the Eurosensors XXII Conference, Procedia Chemistry 1 (2009) 1435-1438, 2009.

Peregrine Semiconductor Corp., "Digitally Tunable Capacitors (DTC)" published online at [http://www.psemi.com/products/digitally-tunable-capacitors-dtc], retrieved from Internet on Apr. 8, 2016, 3 pages.

Linear Technology, "Switched Capacitor Voltage Converter" published online at [http://cds.linear.com/docs/en/datasheet/lt1044.pdf], retrieved from Internet on Apr. 8, 2016, 12 pages.

Dearborn Electronics, "High Voltage | Mica Capacitors" published online at [http://www.dearbornelectronics.com/high-voltage/], retrieved from Internet on Apr. 8, 2016, 1 page.

Maxim Integrated, "LED Driver ICs" published online at [https://www.maximintegrated.com/en/products/power/led-drivers.html], retrieved from Internet as of Apr. 8, 2016, 3 pages.

PRWeb. "Global and China LED Industry Report 2013-2014: Worldwide Industry Share, Investment Trends, Growth, Size, Strategy and Forecast Research Report 2014", Jun. 6, 2014, 6 pages.

* cited by examiner

FIG. 9 first electrode    second electrode

FIG. 10 first electrode    second electrode

METHOD AND APPARATUS FOR AN INTEGRATED CAPACITOR

CROSS-REFERENCE TO RELATED APPLICATIONS

The present application claims the benefit of priority to U.S. Provisional Patent Application No. 62/125,065, filed Jan. 12, 2015, and entitled "An Integrated Capacitor with Both Electrodes Formed by Trenches," the entirety of which application is hereby incorporated herein by reference.

TECHNICAL FIELD

This disclosure relates to an integrated capacitor. More specifically, this disclosure relates to an integrated capacitor with both electrodes formed by trenches for low resistance.

BACKGROUND

Capacitors are indispensable parts for various electronic systems, which are widely used for signal filtering and decoupling, energy transfer and storage, and charge/information retention. Integration of capacitors with high capacitance density and low resistance are leverage in many applications.

For instance, integrated capacitors can be use for power converters, especially power converters with small sizes (e.g. for portable and wearable electronics, fully integrated power supply on-chip (PwrSoC) applications, point-of-load (POL) applications, and granularity power supply applications). Power converters use capacitors to store or release energy at different intervals for a smooth and stable output voltage. For example, in linear voltage regulators or inductive switched-mode power converters, capacitors are connected in parallel with the load to absorb the excessive energy when the output voltage increases and releases the stored energy when the output voltage drops. In switched capacitor power converters, capacitors are used as medium to transfer energy from the input to the load by charging and discharging. In both cases, there will be a ripple current flowing through the capacitor. As a result, integrated capacitors with low resistance are important for achieving high-efficiency power converters.

Another application that leverages capacitors with low resistance are microwaves. In order to achieve a smaller signal distortion, lower loss, and create less heat dissipation in a microwave system, high quality factor (Q) capacitors can be used. The Q factor of a capacitor is defined as the ratio of its reactance to its resistance. Therefore, in order to build integrated microwave systems, integrated capacitors with lower resistance can be leveraged to increase the Q factor.

This background relating to fabrication of integrated capacitors is merely intended to provide a contextual overview of some current capacitor fabrication technology, and is not intended to be exhaustive. Other context regarding current state may become apparent upon review of the following detailed description.

SUMMARY

A simplified summary is provided herein to help enable a basic or general understanding of various aspects of exemplary, non-limiting embodiments that follow in the more detailed description and the accompanying drawings. This summary is not intended, however, as an extensive or exhaustive overview. Instead, the purpose of this summary is to present some concepts related to some exemplary non-limiting embodiments in simplified form as a prelude to more detailed description of the various embodiments that follow in the disclosure.

This disclosure proposes an integrated trench capacitor with low resistance. In the proposed capacitor, both the first electrode and the second electrode of the capacitor can be trench electrodes that can be formed inside the different trenches of a semiconductor substrate. One or both of the electrodes can be isolated from the substrate by a dielectric layer. The trenches can function to increase the area of the dielectric layer, and in turn, increase the capacitance density. However, by accommodating the first electrode and the second electrode in different trenches, the trench capacitor can achieve two additional characteristics.

First additional characteristic is the capacitor can use thick conductive material for both of the electrodes. The depth of the trenches can be in the range of tens of μm, so filling the trenches with a highly conductive material can result in a thick conductive path. Compared with other capacitors using a thin (~1 μm) metal track above the substrate surface, the thick conductive path can significantly reduce the resistance of the capacitor. When the area of the capacitor is large (for example, in power converters), the routing for two electrodes can be very long. However, using a thick conductive path instead of a thin metal track can reduce the resistance of the capacitor.

The second characteristic of the proposed capacitor is shorter current path between two electrodes, which is resulted from both first electrode and the second electrode being extended into the substrate via the trenches. Compared with the prior arts in which one of the electrodes is located on the surface, part of the current must start near the bottom of a trench and flow to the electrode on the surface. In this case, the length of the current path is similar to the depth of the trench. However, in this disclosure, the length of a current path between the two electrodes is determined by the distance between the two electrodes, which is usually an order of magnitude smaller than the depth of the trench. Therefore, the parasitic resistance due to the current flowing between two electrodes are reduced by minimizing the current path length.

In accordance with one or more embodiments of the corresponding disclosure, various non-limiting aspects are described in connection with integrated capacitor devices. In an exemplary, non-limiting embodiment, an integrated capacitor can be formed by a substrate comprising a dielectric layer, a first electrode comprising conductive material formed in a trench, and a second electrode comprising conductive material formed in another trench, wherein the first electrode and the second electrode are isolated from the substrate by a dielectric layer.

In another exemplary, non-limiting embodiment, a method is described that can facilitate the production of an integrated capacitors. The method can comprise forming trenches for accommodating electrodes on a semiconductor substrate, and forming a dielectric layer on the semiconductor substrate and the trenches. The method can also comprise forming a conductive layer comprising a conductive material on the semiconductor substrate and the trenches, and removing a portion of the conductive material on the surface of the substrate, and keeping the conductive material in the trench.

In yet another exemplary, non-limiting embodiment, a method is described that can facilitate the production of an integrated capacitor. The method can comprise forming trenches for accommodating electrodes of the capacitor on a first side of a semiconductor substrate, and forming other trenches for electrical connections on a second side of the semiconductor substrate. A dielectric layer can also be formed on the semiconductor substrate and the trenches, and a conductive layer comprising a conductive material can be formed on the semiconductor substrate. These and other embodiments or implementations are described in more detail below with reference to the drawings.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

In the following description, numerous specific details are set forth to provide a thorough understanding of various embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment," or "an embodiment," means that a particular feature, structure, or characteristic described in connection with the embodiment is included in at least one embodiment. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in one or more embodiments.

As utilized herein, terms "component," "system," "interface," and the like are intended to refer to a computer-related entity, hardware, software (e.g., in execution), and/or firmware. For example, a component can be a processor, a process running on a processor, an object, an executable, a program, a storage device, and/or a computer. By way of illustration, an application running on a server and the server can be a component. One or more components can reside within a process, and a component can be localized on one computer and/or distributed between two or more computers.

Further, these components can execute from various computer readable media having various data structures stored thereon. The components can communicate via local and/or remote processes such as in accordance with a signal having one or more data packets (e.g., data from one component interacting with another component in a local system, distributed system, and/or across a network, e.g., the Internet, a local area network, a wide area network, etc. with other systems via the signal).

As another example, a component can be an apparatus with specific functionality provided by mechanical parts operated by electric or electronic circuitry; the electric or electronic circuitry can be operated by a software application or a firmware application executed by one or more processors; the one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components. In an aspect, a component can emulate an electronic component via a virtual machine, e.g., within a cloud computing system.

The words "exemplary" and/or "demonstrative" are used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

As used herein, the term "infer" or "inference" refers generally to the process of reasoning about, or inferring states of, the system, environment, user, and/or intent from a set of observations as captured via events and/or data. Captured data and events can include user data, device data, environment data, data from sensors, sensor data, application data, implicit data, explicit data, etc. Inference can be employed to identify a specific context or action, or can generate a probability distribution over states of interest based on a consideration of data and events, for example.

Inference can also refer to techniques employed for composing higher-level events from a set of events and/or data. Such inference results in the construction of new events or actions from a set of observed events and/or stored event data, whether the events are correlated in close temporal proximity, and whether the events and data come from one or several event and data sources. Various classification schemes and/or systems (e.g., support vector machines, neural networks, expert systems, Bayesian belief networks, fuzzy logic, and data fusion engines) can be employed in connection with performing automatic and/or inferred action in connection with the disclosed subject matter.

In addition, the disclosed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, computer-readable carrier, or computer-readable media. For example, computer-readable media can include, but are not limited to, a magnetic storage device, e.g., hard disk; floppy disk; magnetic strip(s); an optical disk (e.g., compact disk (CD), a digital video disc (DVD), a Blu-ray Disc™ (BD)); a smart card; a flash memory device (e.g., card, stick, key drive); and/or a virtual device that emulates a storage device and/or any of the above computer-readable media.

A typical capacitor can include three parts: a first electrode, a dielectric layer, and a second electrode. Usually, in integrated capacitors, high-aspect ratio trenches are used to increase the effective area of the dielectric layer for a higher capacitance density. The placement and arrangement of these three parts can result in different structures. In various embodiments herein, processes are used to create an integrated capacitor. To correct for the above-identified deficiencies and/or other drawbacks of integrated capacitors, various embodiments are described herein to facilitate the creation of integrated capacitors with a small parasitic resistance.

FIGS. 1-12 illustrate apparatuses, methods, and articles of manufacture that facilitate development of integrated capacitors. For simplicity of explanation, the methods algorithms) are depicted and described as a series of acts. It is to be understood and appreciated that the various embodiments are not limited by the acts illustrated and/or by the order of acts. For example, acts can occur in various orders and/or concurrently, and with other acts not presented or described herein. Furthermore, not all illustrated acts may be required to implement the methods. In addition, the methods could alternatively be represented as a series of interrelated states via a state diagram or events. Additionally, the methods described hereafter are capable of being stored on an article of manufacture (e.g., a computer readable storage medium) to facilitate transporting and transferring such methods to computers. The term article of manufacture, as used herein, is intended to encompass a computer program accessible from any computer-readable device, carrier, or media, including a non-transitory computer readable storage medium.

Figure 1:
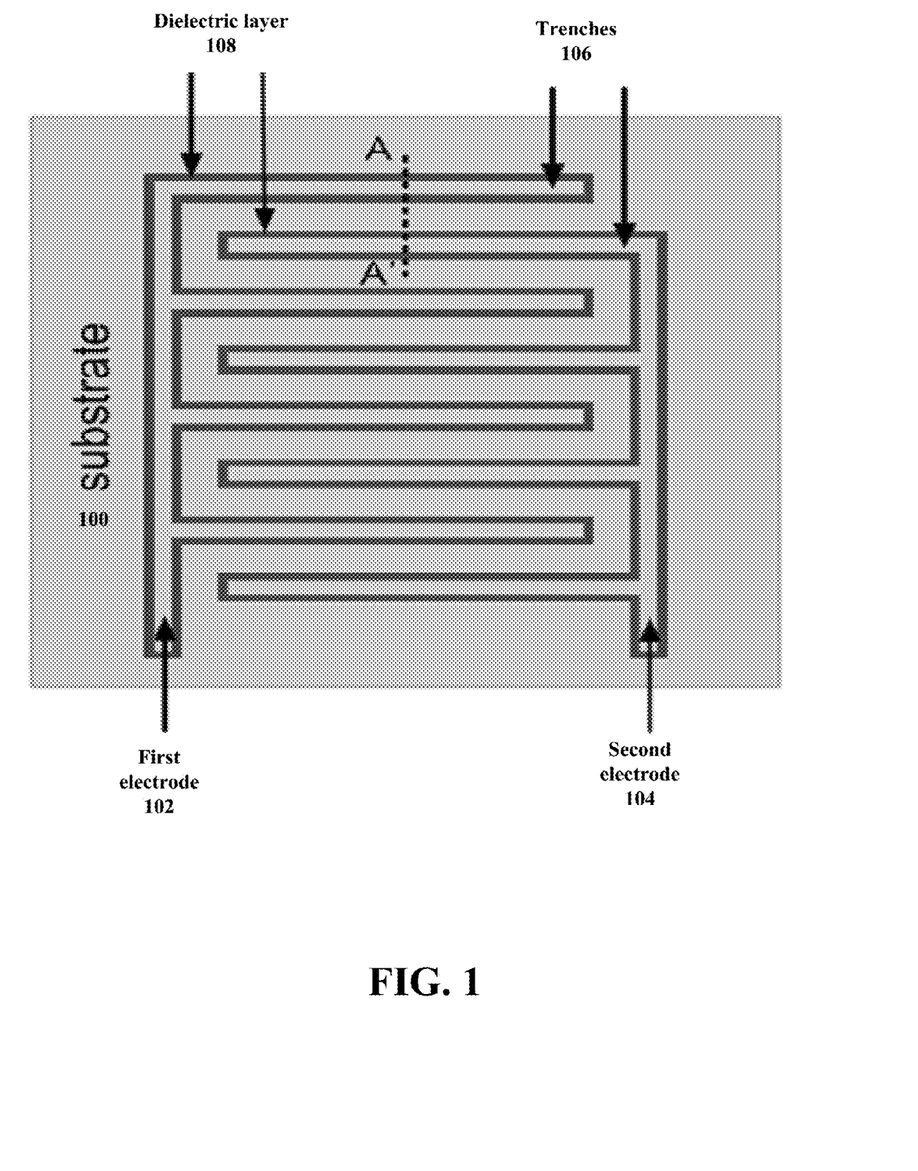
FIG. 1 illustrates a schematic of a top view of an example capacitor.

Referring now to FIG. 1, illustrated is a schematic of a top view of an example capacitor. A substrate 100 can comprise a first electrode 102 and a second electrode 104, which are both formed by filling trenches 106 with a conductive material. The first electrode 102 and the second electrode 104 can be isolated from the substrate 100 by dielectric layers 108.

Figure 2:
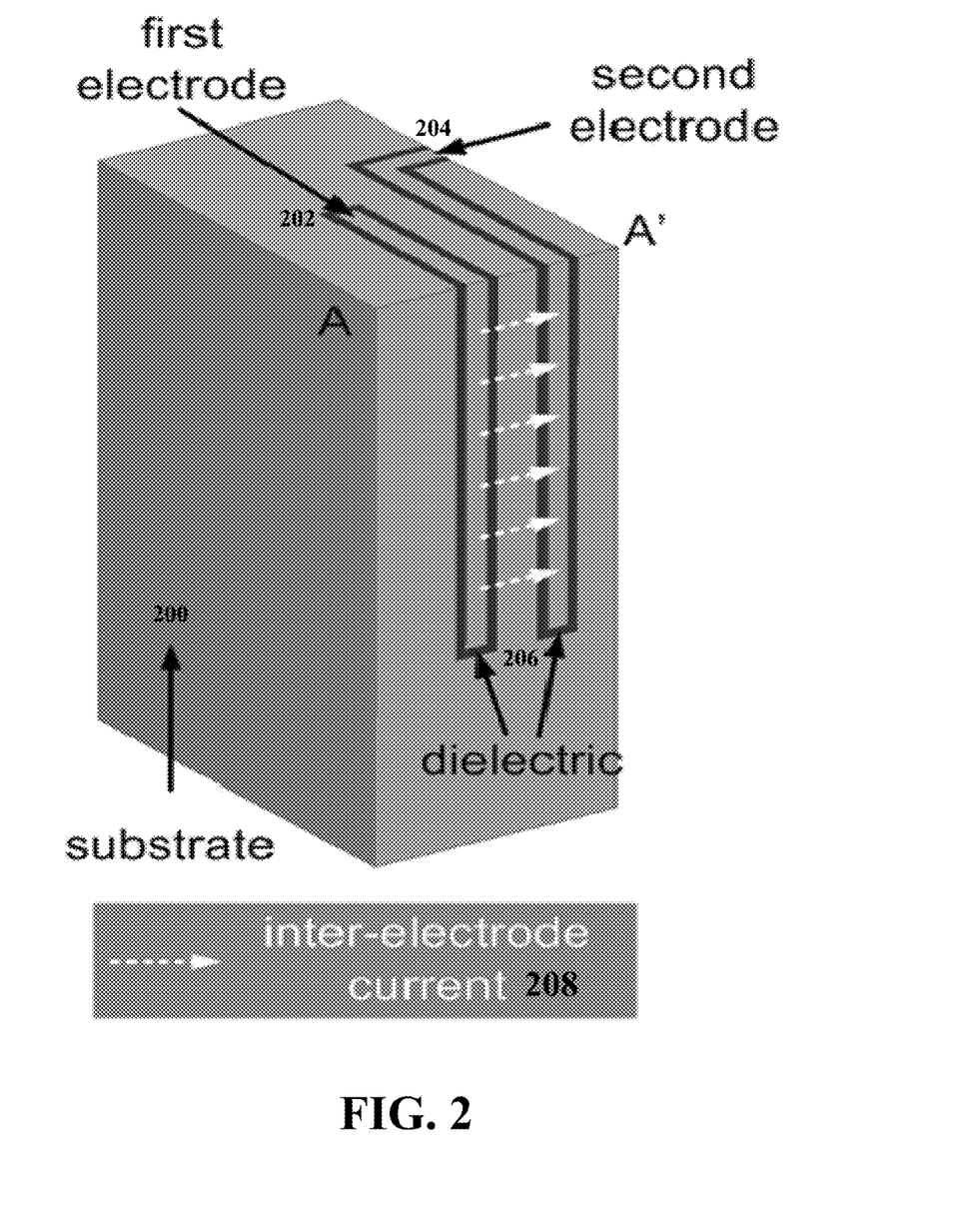
FIG. 2 illustrates a schematic of an example three-dimensional view of a capacitor.

Referring now to FIG. 2, illustrated is a schematic of an example three-dimensional view of a capacitor. An inter-electrode current 208 can flow through a substrate 200 as shown. The length of a current path of the inter-electrode current 208 is the distance between two trenches of a first electrode 202 and a second electrode 204, wherein the first electrode 202 and the second electrode 204 are isolated from the substrate 200 by a dielectric layer 206. The capacitor represented in FIG. 2 can allow the inter-electrode current 208 to flow uniformly to avoid current crowding and thus resulted in a lower resistance.

Figure 3:
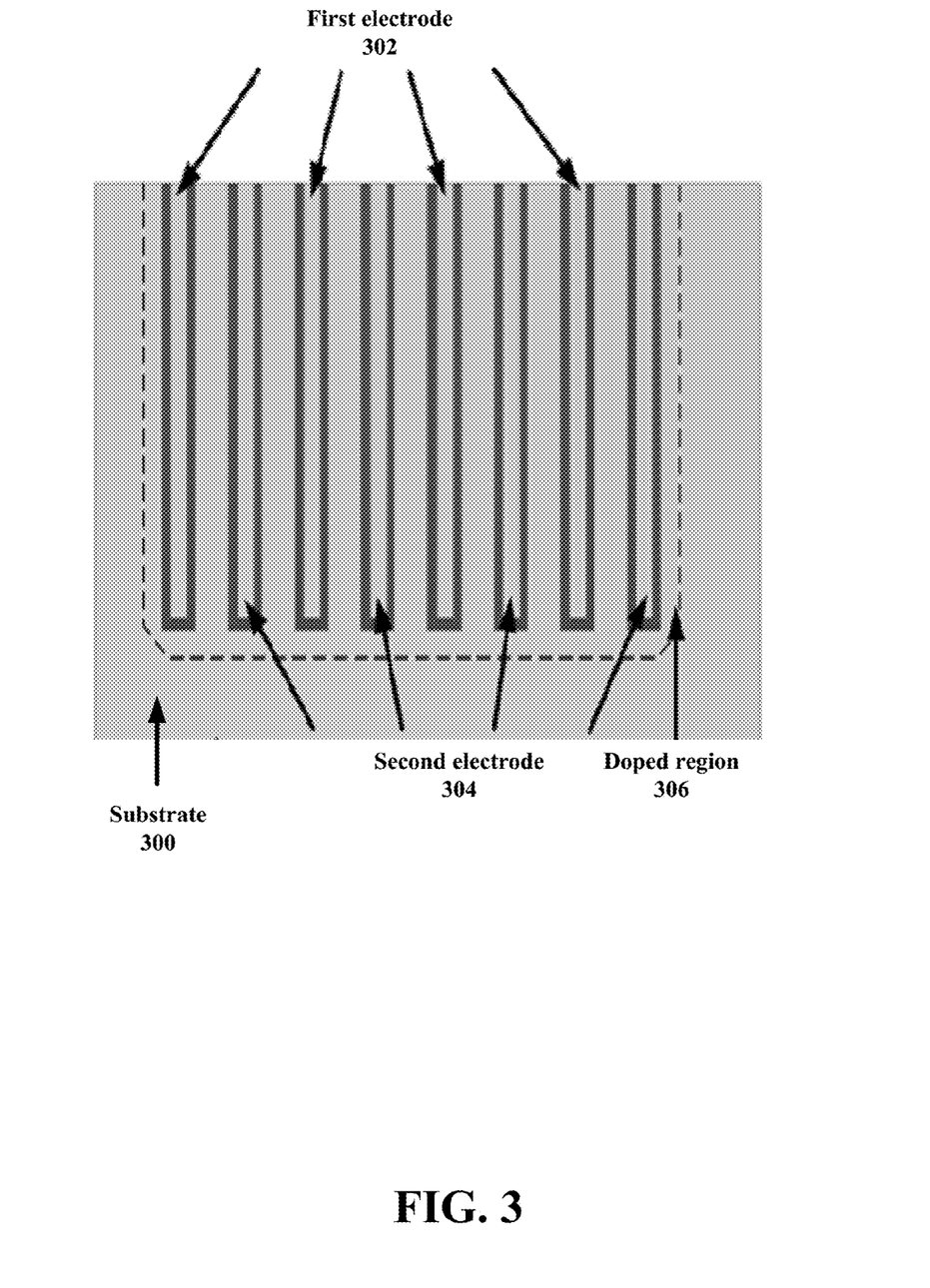
FIG. 3 illustrates a schematic of an example cross-sectional view of a capacitor.

Referring now to FIG. 3, illustrated is a schematic of an example cross-sectional view of a capacitor. A first electrode 302 and a second electrode 304 can be interleaved into a substrate 300. To decrease resistance within the capacitor, a doped region 306 can be formed around trenches of the first electrode 302 and the second electrode 304. The doped region 306 can have the same or different type of doping with substrate 300. If the doping of region 306 and substrate 300 are of different types (e.g. p-type and n-type), a junction isolation can be formed between region 306 and substrate 300.

Figure 4:
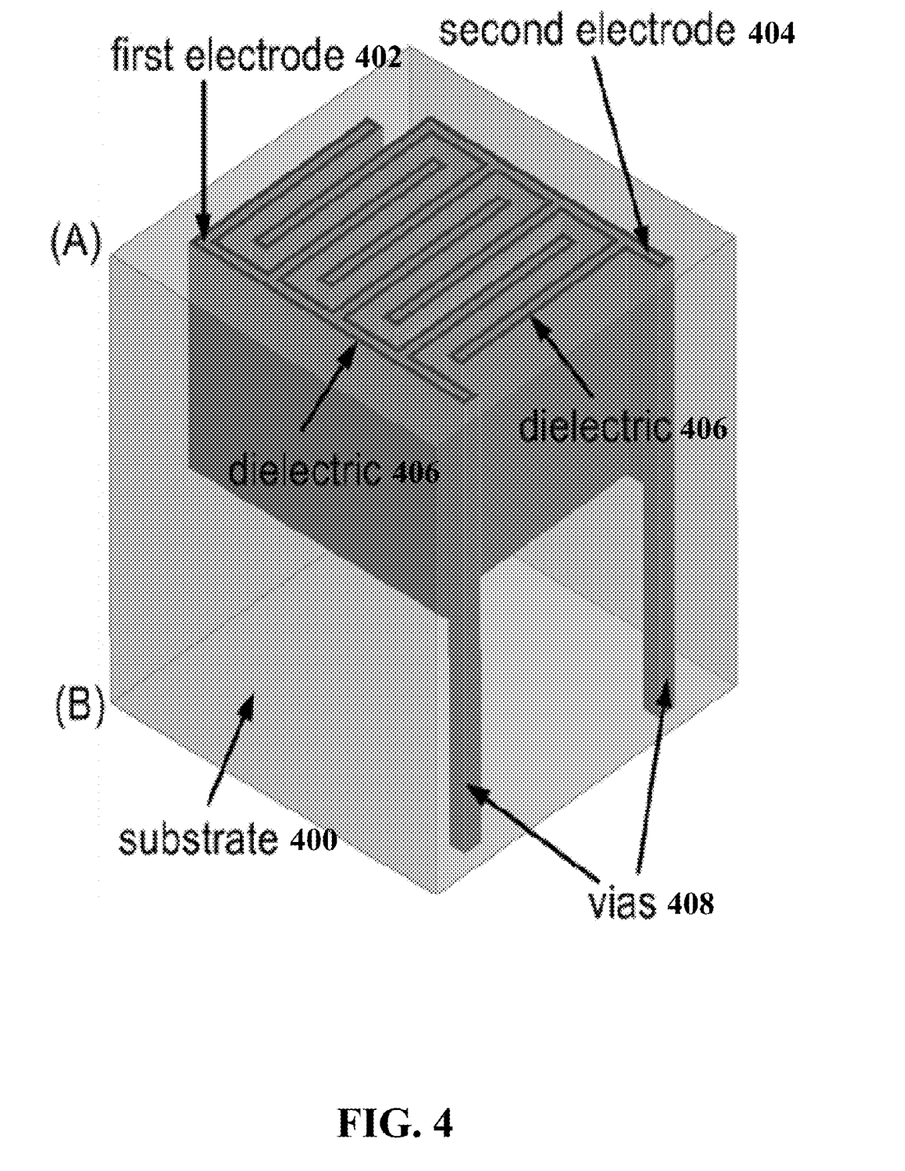
FIG. 4 illustrates a schematic of an example capacitor with vias to connect two electrodes.

Referring now to FIG. 4, illustrated is a schematic of an example capacitor with vias to connect two electrodes. In this structure, the trenches of the capacitor are formed on one surface (A) of a substrate 400, and the two electrodes 402, 404 of the capacitor are connected by vias 408 to the other surface (B) of the substrate 400. Surface (B) is on the opposite side of substrate to surface (A). The two electrodes 402, 404 of the capacitor can be isolated from the substrate 400 by dielectric layers 406. Therefore, surface (B) can be used for placement of other circuit components, such as integrated circuits and power transistors, which can result in a compact integration of capacitors and other circuit components.

Figure 5:
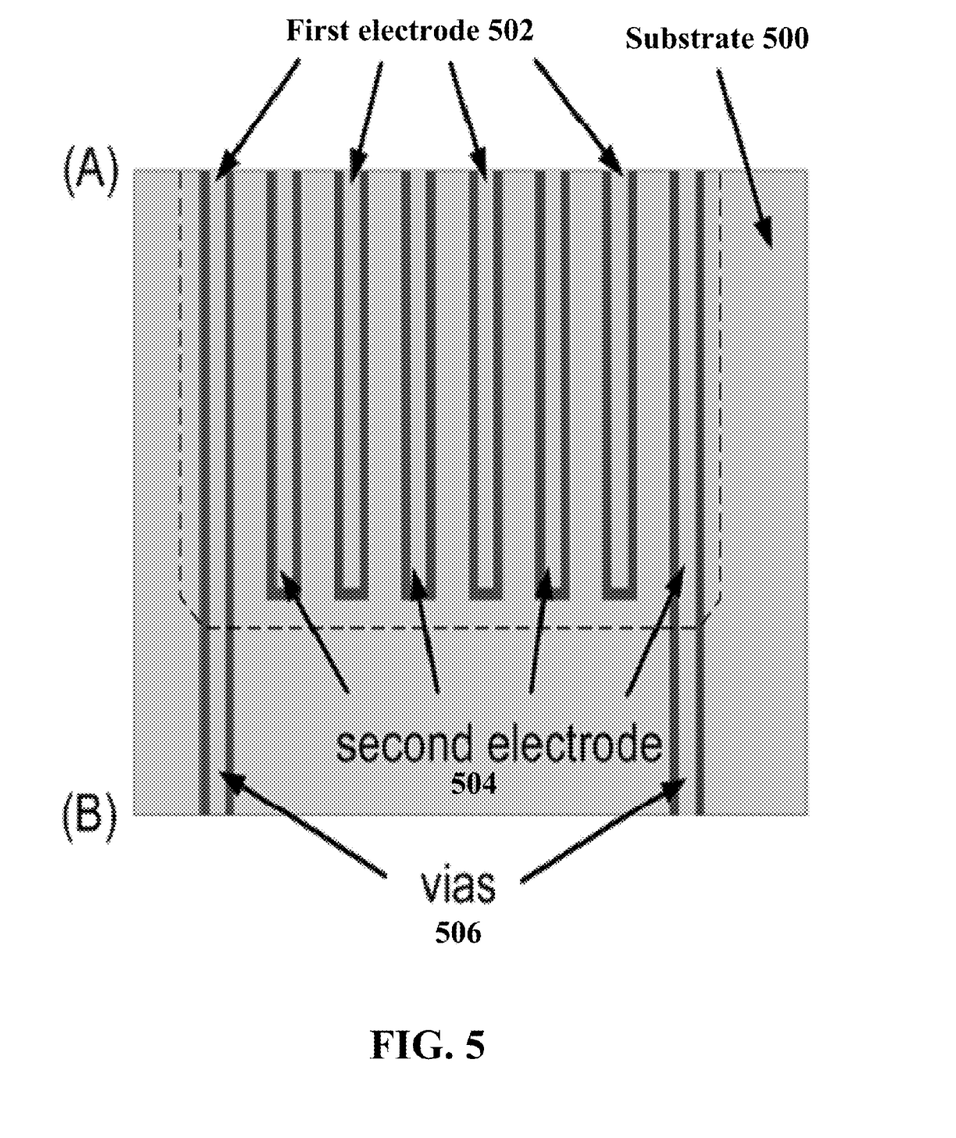
FIG. 5 illustrates a schematic of an example cross-sectional view of the capacitor with vias to connect the two electrodes.

Referring now to FIG. 5, illustrated is a schematic of an example cross-sectional view of the capacitor with vias to connect the two electrodes. In this figure, trenches are formed on surface (A) so that surface (B) of the substrate 500 is available for placing other circuit components. The first electrode 502 and the second electrode 504 can be connected by vias 508 to surface (B) of the substrate 500.

Figure 6:
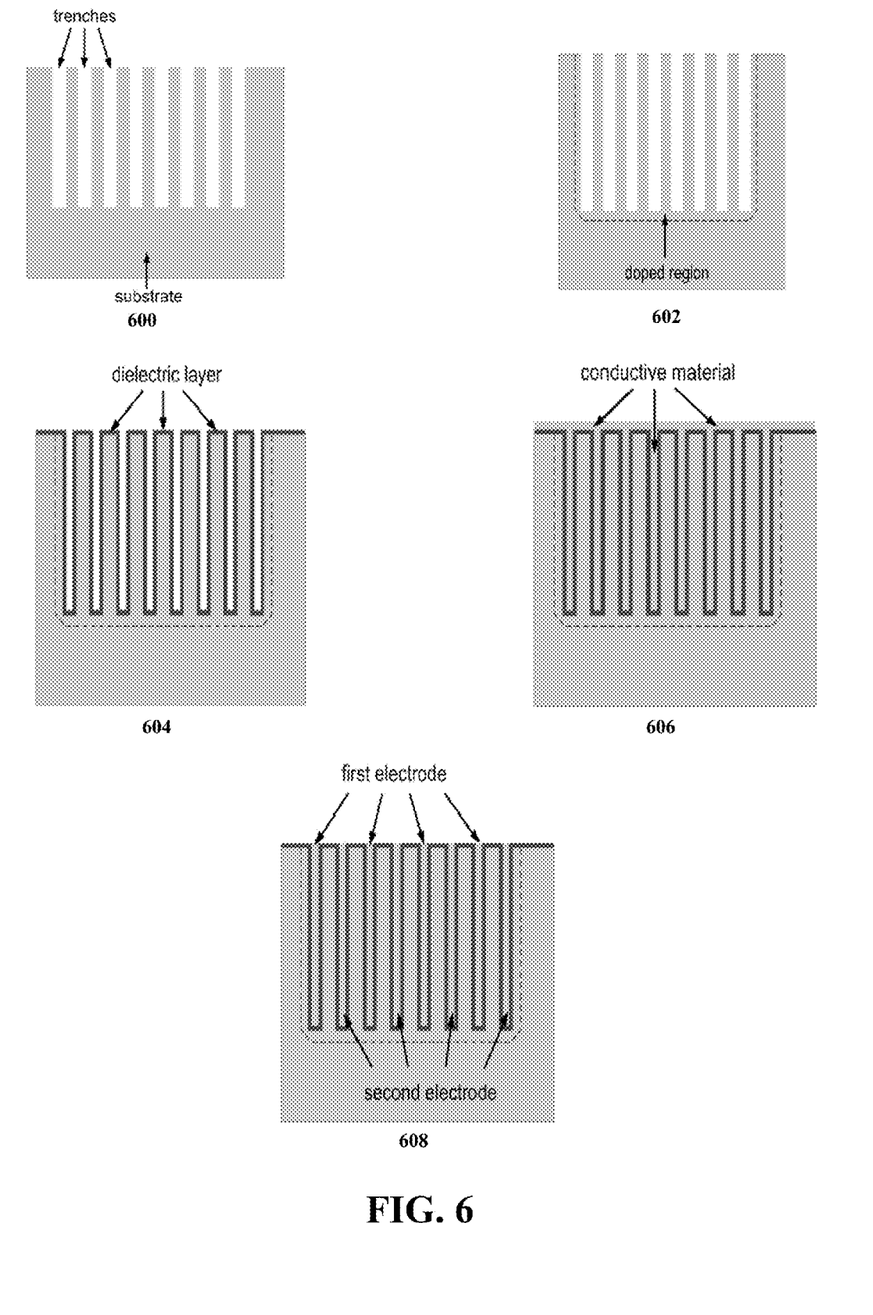
FIG. 6 illustrates a schematic of an example process flow for fabrication of the capacitor.

Referring now to FIG. 6, illustrated is a schematic of an example process flow for fabrication of the capacitor. A formation of trenches 600 in a semiconductor substrate can be accomplished by dry etching, wet-etching, electrochemical etching or other etching techniques. After the formation of trenches 600, an optional step of doping 602 the semiconductor substrate in proximity to the trenches can be performed for additional reduction of resistance (and/or forming junction isolation with the substrate). A formation of a dielectric layer 604 can be facilitated by thermal oxidation or other deposition technology such as chemical vapor deposition, evaporation, sputtering, or atomic-layer-deposition. Dielectric layer 604 can be silicon dioxide, silicon nitride, aluminum oxide, hafnium oxide, and any other type of dielectric material or a combination/stack of two or more dielectric materials. Thereafter, a formation of a conductive layer 606 can be accomplished, wherein the conductive layer can be a highly doped poly-silicon formed by chemical vapor deposition, sputtering, electroplated copper, deposited aluminum, gold, titanium, or other good conducting material. Subsequently, a removal of a portion (or an excess) of a conductive material 608 used to form the conductive layer 606 can be facilitated by chemical-mechanical polishing or etching so that the two electrodes of the capacitor can be separated and isolated from each other.

Figure 7:
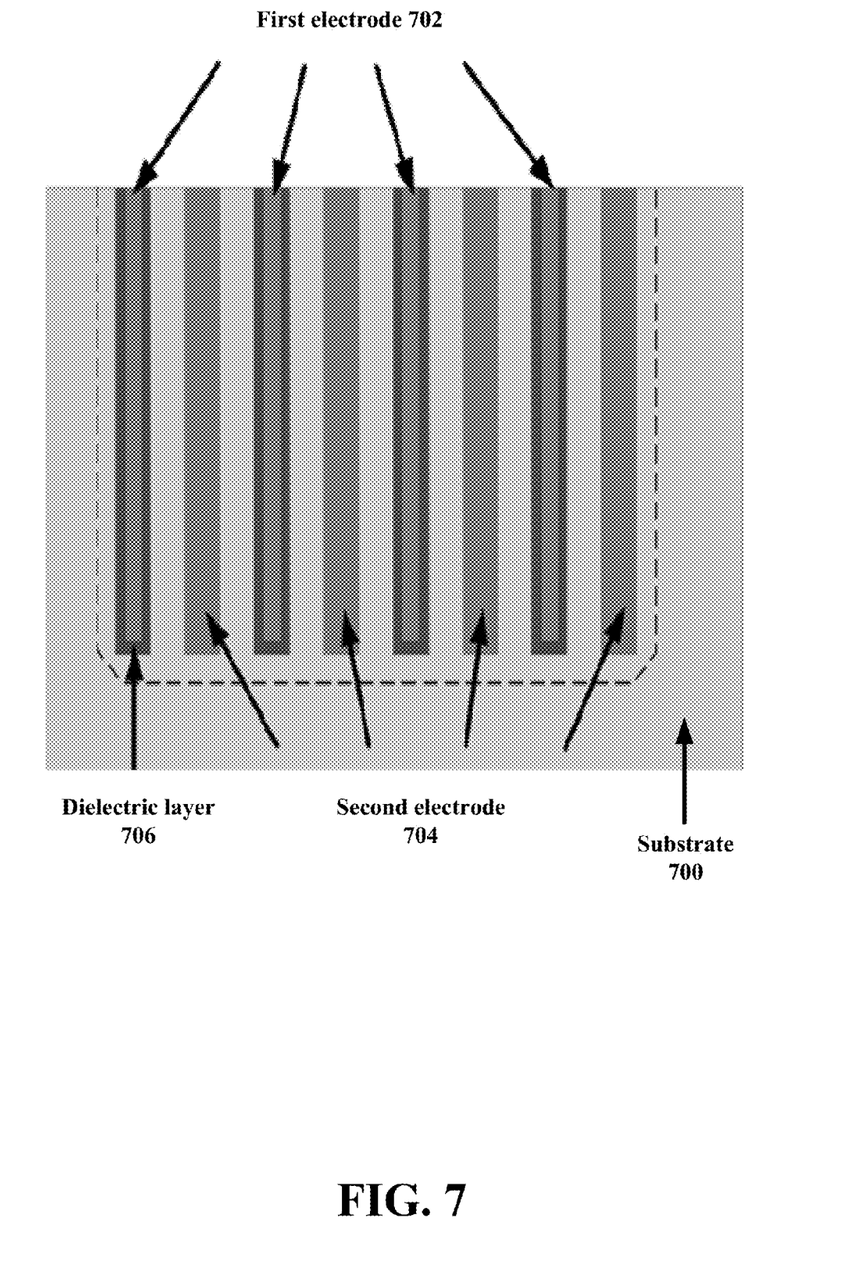
FIG. 7 illustrates a schematic of an example cross-sectional view where only one electrode is isolated from the substrate by the dielectric layer.

Referring now to FIG. 7, illustrated a schematic of an example cross-sectional view where only one electrode is isolated from the substrate by the dielectric layer. In this embodiment, only one of the electrodes (e.g. for this example the first electrode 702) is isolated with the substrate 700 by the dielectric layer 706. The other electrode (e.g. the second electrode 704) is directly contacted with the substrate 700 in the trenches. It should be noted that for this particular embodiment, the first electrode 702 was isolated, but in practice any electrode (e.g. first, second, third, etc.) can be isolated based on an associated naming convention.

Figure 8:
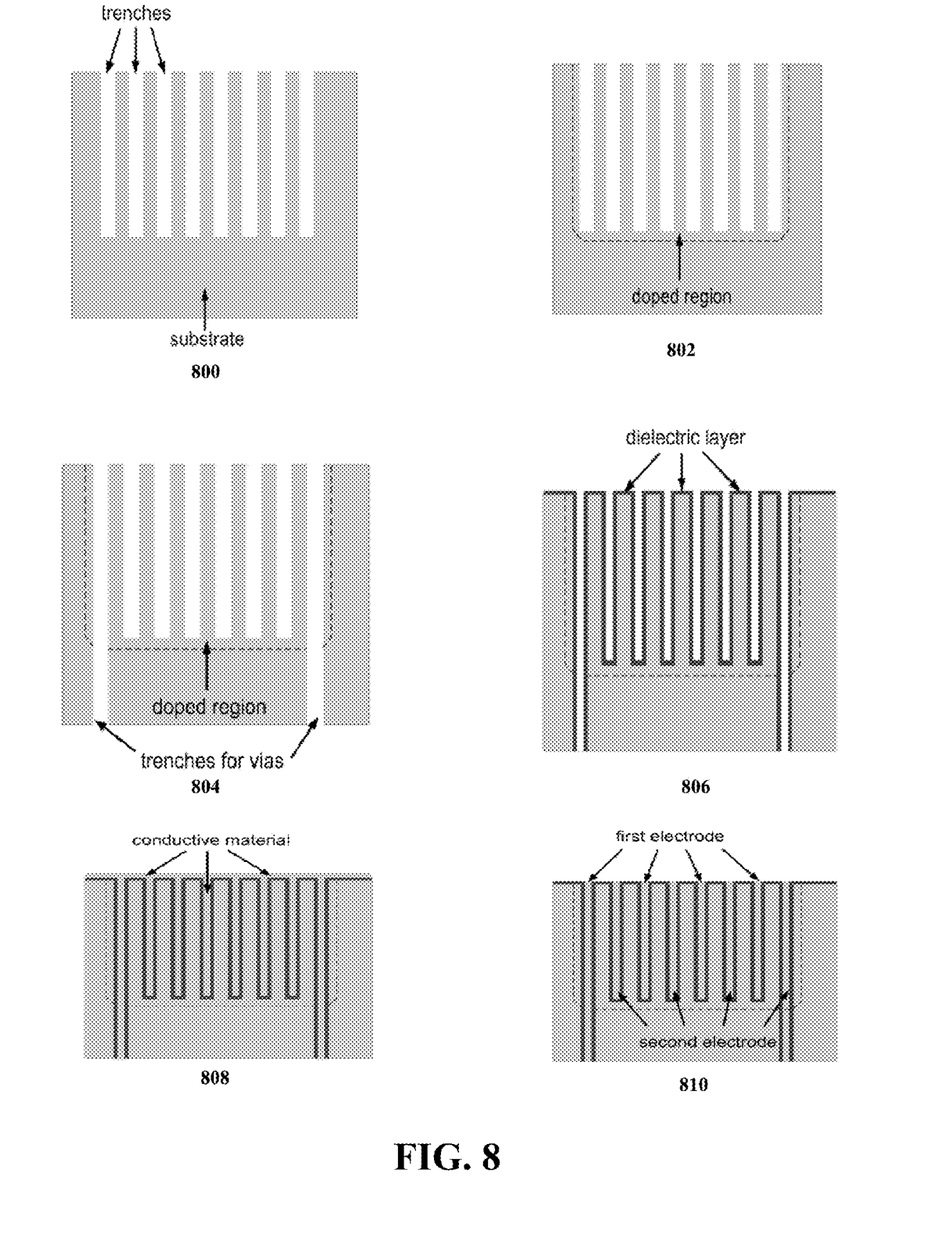
FIG. 8 illustrates a schematic of another example process flow for fabrication of the capacitor with vias formed on the other surface of the substrate.

Referring now to FIG. 8, illustrated a schematic of another example process flow for fabrication of the capacitor with vias formed on the other surface of the substrate. A formation of trenches 800 in a semiconductor substrate can be accomplished by dry etching, wet-etching, electrochemical etching or other etching techniques. After the formation of trenches 800, an optional step of doping 802 the semiconductor substrate in proximity to the trenches can be performed for additional reduction of resistance (and/or forming junction isolation with substrate). Next, a formation of trenches for vias 804 can be formed from the other side of the substrate. A formation of a dielectric layer 806 can be facilitated by thermal oxidation or other deposition technology such as chemical vapor deposition, evaporation, sputtering, or atomic-layer-deposition. Thereafter, a formation of a conductive layer 808 can be accomplished, wherein the conductive layer can be a highly doped poly-silicon formed by chemical vapor deposition, sputtered or electroplated copper, or other good conducting material. Subsequently, a removal of a portion (or an excess) of a conductive material 810 used to form the conductive layer 808 can be facilitated by chemical-mechanical polishing or etching so that the two electrodes of the capacitor can be separated and isolated from each other.

Figure 9:
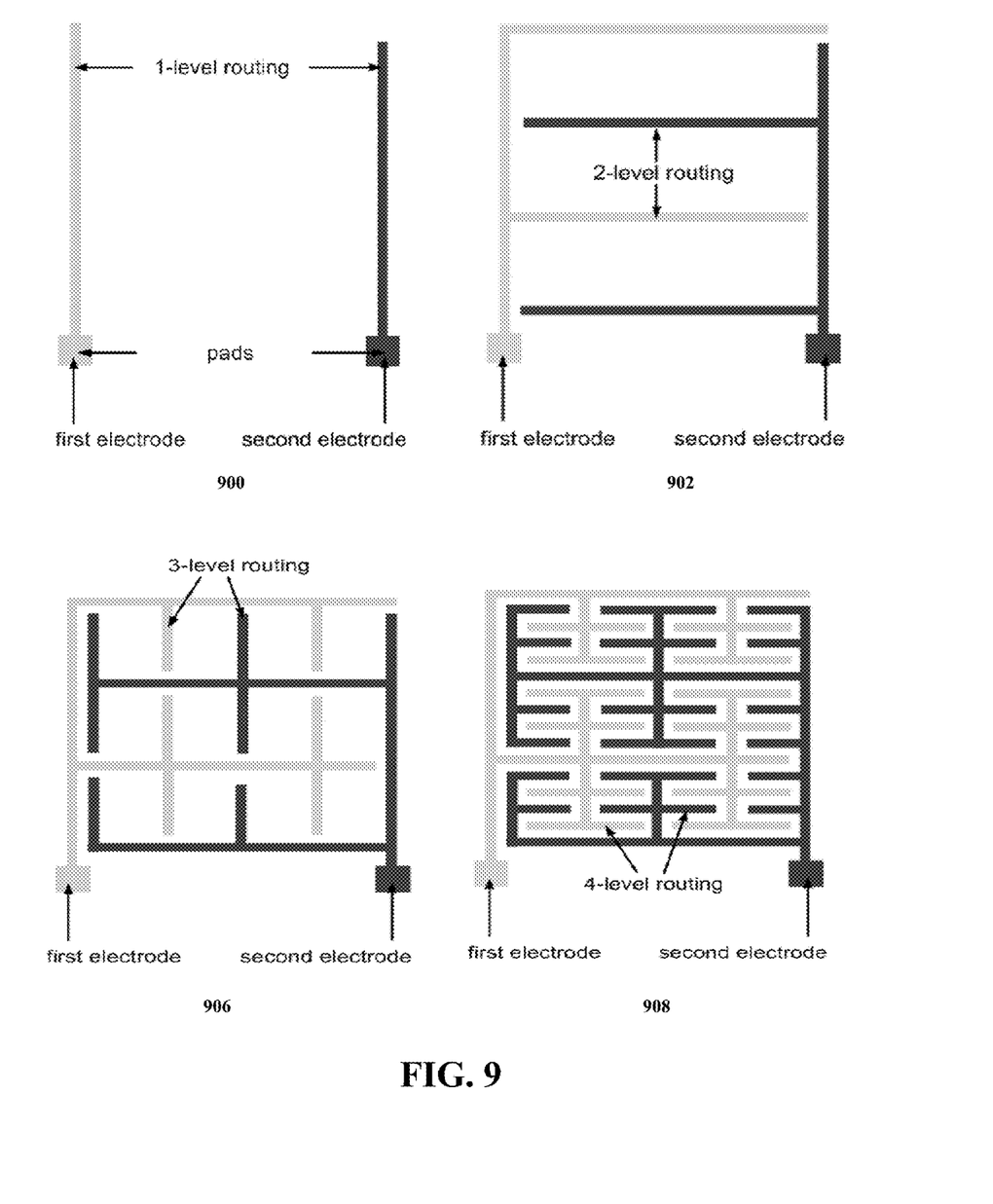
FIG. 9 illustrates a schematic of an example process for designing a routing layout for the two electrodes.

Referring now to FIG. 9, illustrated is a schematic of an example process for designing a routing layout for two electrodes. 1-level routing can extend from two pads of a first and a second electrode of the capacitor at 900. At 902, a 2-level routing can extend from the 1-level routing, and 906 illustrates a 3-level routing can extend from the 2-level routing. At 908, a 4-level routing can extend from the 3-level routing. In practice, more or less levels of routing can be introduced depending on the size and pitch of the routings. The aforementioned interleaved layout can effectively utilize the area, and also suppress eddy current in the electrode and the substrate.

Figure 10:
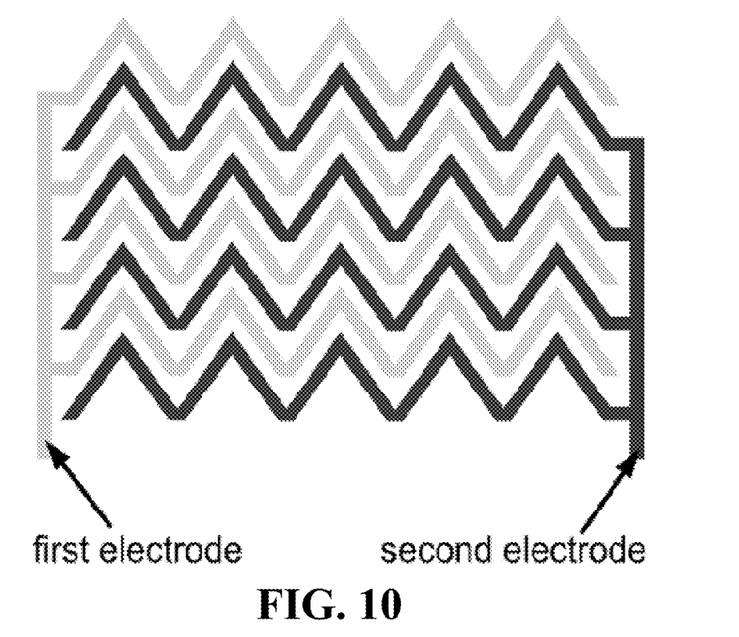
FIG. 10 illustrates a schematic of an example curved formed routing.

Referring now to FIG. 10, illustrated is a schematic of an example curved and formed routing. FIG. 10 shows the routing in the form of triangular polyline.

Figure 11:
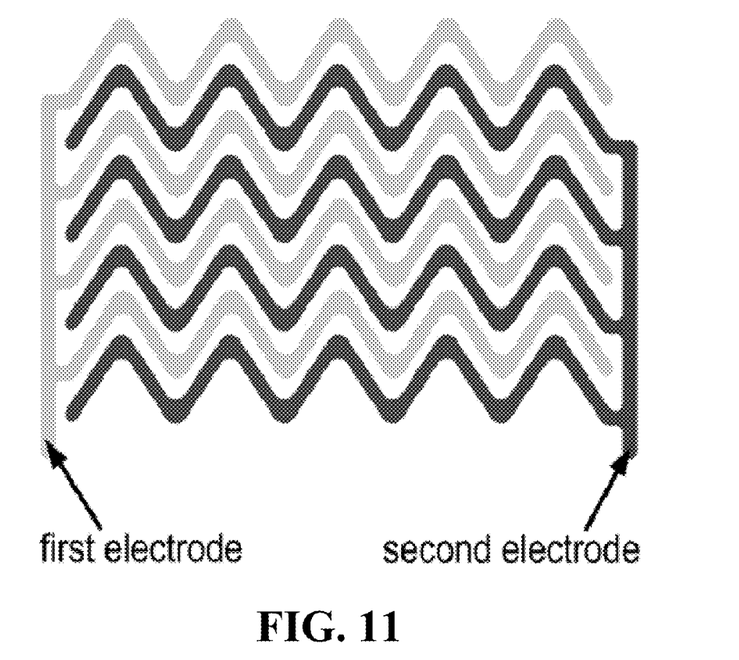
FIG. 11 illustrates a schematic of an example rugged formed routing.

Referring now to FIG. 11, illustrated is a schematic of an example rugged formed routing. FIG. 11 shows that the angles formed by straight-lines in FIG. 10 can be replaced with rounded corners to improve a breakdown voltage.

Figure 12:
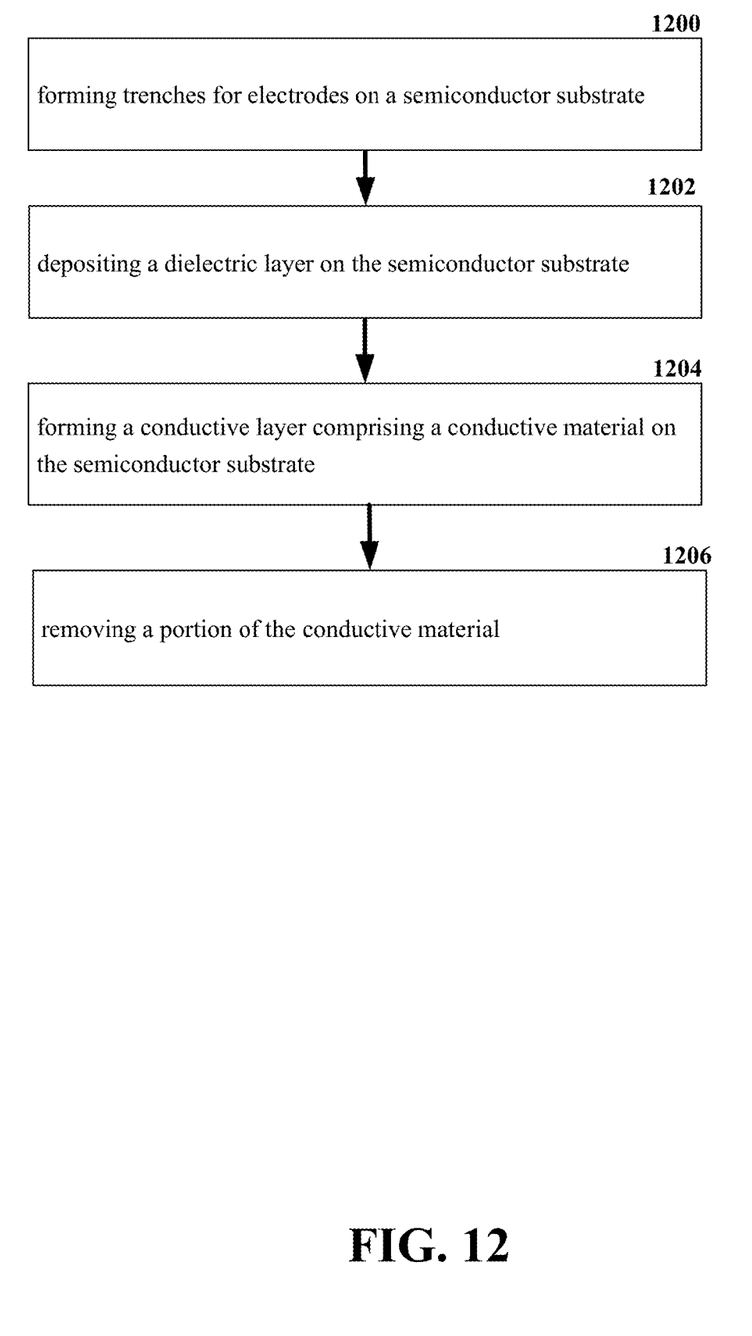
FIG. 12 illustrates a schematic process flow diagram of a method for creating a capacitor.

Referring now to FIG. 12, illustrated is a schematic process flow diagram of a method for creating a capacitor. At element 1200, trenches can be formed for electrodes on a semiconductor substrate. At element 1202, a dielectric layer can be deposited on a semiconductor substrate. A conductive layer comprising a conductive material can be formed on the semiconductor substrate at element 1204; and a portion of the conductive material can be removed at element 1206.

It is noted a computer environment can be utilized to execute or implement portion(s) of the various embodiments described herein, e.g., switching or voltage control. Those skilled in the art will recognize that the various aspects, such as switching or voltage control, can be implemented as software, hardware, or in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects may also be practiced in distributed computing environments where certain tasks are performed by remote processing devices that are linked through a communications network. In a distributed computing environment, program modules can be located in both local and remote memory storage devices.

A computer typically includes a variety of computer-readable media. Computer-readable media can be any available media that can be accessed by the computer and includes both volatile and nonvolatile media, removable and non-removable media. By way of example, and not limitation, computer-readable media can comprise computer storage media and communication media. Computer storage media includes both volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital video disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media. Further, computer instructions/operations can be stored in memory in the form of non-transitory, or tangible, computing elements (e.g., computer readable storage medium), where such instructions/operations can be executed, e.g., by a processor, to facilitate operation of one or more exemplary, non-limiting embodiments, as presented herein.

As used in this application, the terms "component," "system," "platform," "layer," "controller," "terminal," "station," "node," "interface" are intended to refer to a computer-related entity or an entity related to, or that is part of, an operational apparatus with one or more specific functionalities, wherein such entities can be either hardware, a combination of hardware and software, software, or software in execution. For example, a component can be, but is not limited to being, a process running on a processor, a processor, a hard disk drive, multiple storage drives (of optical or magnetic storage medium) including affixed (e.g., screwed or bolted) or removably affixed solid-state storage drives; an object; an executable; a thread of execution; a computer-executable program, and/or a computer. By way of illustration, both an application running on a server and the server can be a component. One or more components can reside within a process and/or thread of execution, and a component can be localized on one computer and/or distributed between two or more computers. Also, components as described herein can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that provides at least in part the functionality of the electronic components. As further yet another example, interface(s) can include input/output (I/O) components as well as associated processor, application, or Application Programming Interface (API) components. While the foregoing examples are directed to aspects of a component, the exemplified aspects or features also apply to a system, platform, interface, layer, controller, terminal, and the like.

What has been described above includes examples of the various embodiments. It is, of course, not possible to describe every conceivable combination of components or methodologies for purposes of describing the disclosed subject matter, but one of ordinary skill in the art may recognize that many further combinations and permutations of the various embodiments are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising".

As used herein, the terms "to infer" and "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the term "set" as employed herein excludes the empty set; e.g., the set with no elements therein. Thus, a "set" in the subject disclosure includes one or more elements or entities. As an illustration, a set of controllers includes one or more controllers; a set of data resources includes one or more data resources; etc. Likewise, the term "group" as utilized herein refers to a collection of one or more entities; e.g., a group of nodes refers to one or more nodes.

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the subject matter has been described herein in connection with various embodiments and corresponding FIGs, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. An apparatus, comprising:
   a substrate comprising a dielectric layer;
   a first electrode comprising a conductive material formed in a first trench of the substrate, wherein the dielectric layer is situated between the first electrode and the substrate; and a second electrode comprising the conductive material formed in a second trench of the substrate, wherein the dielectric layer is situated between the second electrode and the substrate, resulting in a section of the substrate being situated between the dielectric layer of the first trench and the second trench.

2. The apparatus of claim 1, wherein the substrate conducts an inter-electrode current.

3. The apparatus of claim 1, further comprising:
a doped region, wherein the first trench and the second trench are within the doped region.

4. The apparatus of claim 1, further comprising:
a first set of vias connected to the first electrode, and a second set of vias connected to the second electrode.

5. The apparatus of claim 4, wherein the substrate comprises a first surface and a second surface opposite each other, and wherein the first trench and the second trench are formed on the first surface of the substrate, and are connected to the second surface of the substrate by the first set of vias and the second set of vias.

6. An apparatus, comprising:
a substrate comprising a dielectric layer;
a first electrode comprising a conductive material formed in a first trench of the substrate, wherein the dielectric layer is situated between the first electrode and the substrate; and
a second electrode comprising the conductive material formed in a second trench of the substrate, and the conductive material forms electrical contact with the substrate, resulting in a section of the substrate being positioned between the dielectric layer of the first trench and the second trench.

7. The apparatus of claim 6, wherein the first trench and the second trench are formed on the first surface of the substrate, and wherein the first trench and the second trench are connected to a second surface of the substrate by a first set of vias and by a second set of vias.

8. The apparatus of claim 6, wherein the first set of vias are connected to the first electrode and the second set of vias are connected to the second electrode.

9. The apparatus of claim 6, wherein the substrate conducts an inter-electrode current and a doped region, wherein the first trench and the second trench are within the doped region.

10. A method, comprising:
forming trenches for electrodes on a semiconductor substrate;
forming a dielectric layer on the semiconductor substrate, resulting in a section of the substrate being located between the dielectric layer of a first trench of the trenches and a second trench of the trenches;
forming a conductive layer comprising a conductive material on the semiconductor substrate; and
removing a portion of the conductive material.

11. The method of claim 10, wherein the forming the trenches comprises wet etching the trenches.

12. The method of claim 10, wherein the forming the trenches comprises plasma etching the trenches.

13. The method of claim 10, wherein the forming the trenches comprises electrochemically etching the trenches.

14. The method of claim 10, further comprising:
doping the semiconductor substrate in proximity to the trenches.

15. The method of claim 10, wherein the forming the dielectric layer comprises thermally oxidizing the dielectric layer.

16. The method of claim 10, wherein the forming the dielectric layer comprises applying a chemical vapor deposition to form the dielectric layer.

17. A method of making an integrated capacitor, comprising a process of:
forming trenches for electrodes on a first side of a semiconductor substrate;
forming other trenches for electrical connections on a second side of the semiconductor substrate;
forming a dielectric layer on the semiconductor substrate, wherein the forming the dielectric layer results in a section of the semiconductor substrate being between a first portion of the dielectric layer of a first trench of the trenches and a second portion of the dielectric layer of a second trench of the trenches;
forming a conductive layer comprising a conductive material on the semiconductor substrate; and
removing a portion of the conductive material.

18. The integrated capacitor produced by the process of claim 17, wherein the forming the trenches comprises forming the trenches using etching.

19. The integrated capacitor produced by the process of claim 17, further comprising:
doping the semiconductor substrate in proximity to the trenches.

20. The integrated capacitor produced by the process of claim 17, wherein the forming the dielectric layer comprises forming the dielectric layer using an evaporation process.

21. The integrated capacitor produced by the process of claim 17, wherein the forming the dielectric layer comprises forming the dielectric layer using a thermal oxidation process.

22. The integrated capacitor produced by the process of claim 17, wherein the forming the dielectric layer comprises forming the dielectric layer using a chemical vapor deposition process.

23. The integrated capacitor produced by the process of claim 13, wherein the forming the dielectric layer comprises forming the dielectric layer using thermal oxidation.

24. The integrated capacitor produced by the process of claim 13, wherein the removing the excess of the conductive material comprises using a chemical-mechanical polishing process.

25. The integrated capacitor produced by the process of claim 17, wherein the conductive layer comprises doped silicon.

26. The integrated capacitor produced by the process of claim 17, wherein the forming the conductive layer comprises using a chemical vapor deposition.

* * * * *